(12) United States Patent
Sangalang et al.

(10) Patent No.: US 8,154,113 B2
(45) Date of Patent: Apr. 10, 2012

(54) INTERCONNECT AND TEST ASSEMBLY INCLUDING AN INTERCONNECT

(75) Inventors: Jesus S. Sangalang, Dublin, CA (US); Kazuya Takahashi, San Jose, CA (US)

(73) Assignee: Yamaichi Electronics USA, Inc., San Jose, CA (US)

( * ) Notice: Subject to any disclaimer, the term of this patent is extended or adjusted under 35 U.S.C. 154(b) by 0 days.

(21) Appl. No.: 13/042,905

(22) Filed: Mar. 8, 2011

(65) Prior Publication Data

US 2011/0215459 A1 Sep. 8, 2011

Related U.S. Application Data

(60) Provisional application No. 61/311,756, filed on Mar. 8, 2010.

(51) Int. Cl.
*H01L 23/48* (2006.01)
*H01L 23/04* (2006.01)

(52) U.S. Cl. . 257/698; 257/690; 257/738; 257/E23.011; 257/E23.181

(58) Field of Classification Search .......... 257/698, 257/690, 738, E23.011, E23.181
See application file for complete search history.

(56) References Cited

U.S. PATENT DOCUMENTS 6,574,114 B1 * 6/2003 Brindle et al. ............... 361/769

* cited by examiner

*Primary Examiner* — Long Pham
(74) *Attorney, Agent, or Firm* — Squire Sanders (US) LLP

(57) ABSTRACT

An interconnect includes an elastic body, an electric conductor and a spacer. The elastic body has a first surface, a second surface, a first hole extending from the first surface to the second surface, and a second hole extending from the first surface to the second surface. The electric conductor is disposed in the first hole of the insulating body for contacting one of a plurality of balls of the first integrated circuit package and one of a plurality of conductor pads of the second integrated circuit package. The electric conductor includes an elastic body and electric conductor particles disbursed in the elastic body. The spacer is disposed in the second hole.

20 Claims, 5 Drawing Sheets

INTERCONNECT AND TEST ASSEMBLY INCLUDING AN INTERCONNECT

CROSS-REFERENCE TO RELATED APPLICATIONS

This application claims the benefit of U.S. Provisional Application No. 61/311,756, filed Mar. 8, 2010, the entire disclosure of which is incorporated herein by reference.

FIELD OF THE INVENTION

The present invention relates to an interconnect for providing a connection between two integrated circuit packages such as a Package on Package assembly and to a test assembly having such an interconnect.

BACKGROUND OF THE INVENTION

Package on Package (PoP) is an integrated circuit packaging technique that allows two or more integrated circuit packages, such as separate logic and memory packages, to be stacked on top of one another. Between the packages is an interface for transmitting signals between them. The interface typically includes a ball grid array (BGA) on the bottom of the top package. The ball grid array includes solder balls attached to the bottom of the top package. The interface also includes conductor pads such copper pads on the top surface of the bottom package. The conductor pads are arranged in a pattern that matches the solder balls. When the packages are assembled, the package assembly is heated, either in a reflow oven or by an infrared heater, causing the solder balls to melt and adhere to the conductor pads to connect the top and bottom packages both electrically and physically.

A similar connection can be made between the logic package and a motherboard with the BGA on the bottom of the logic package and conductor pads on the top of the motherboard.

A main benefit of PoP is to save space on the motherboard. Another is to decouple the memory device from the logic device, allowing different combinations of memory and logic packages. This means memory packages from different suppliers can be used with different logic packages. Furthermore, the memory and logic packages can be tested separately or together.

When a PoP assembly is tested, the packages are not soldered together so that the assembly can be disassembled and the packages can be used again with other packages. Instead, an interconnect is placed between the packages to temporarily connect the solder balls of one package to the conductor pads of the other package. An interconnect typically includes vertically placed probe pins that extends from the top surface of the interconnect to the bottom surface. When the packages are assembled with the interconnect disposed therebetween, one end of each pin is connected to a solder ball on the bottom of the top package, and the other end of the probe pin is connected to the corresponding pad on the top of the bottom package, to provide an electrical connection between the solder ball and the pad.

When probe pins are used to connect the two packages, the probe pins are pressed into the solder balls and pads of the packages, making it difficult for the packages to have relative movement. Additionally the solder balls and pads of the packages may be damaged by the probe pins during repeated use.

BRIEF SUMMARY OF THE INVENTION

The present invention overcomes some of the problems associated with the prior art. According to a first aspect of the invention, an interconnect includes an elastic body, an electric conductor and a spacer. This interconnect does not use probe pins and therefore allows the connected packages to move relatively to each other. Additionally, the interconnect does not damage solder balls and conductor pads.

The elastic body of the interconnect has a first surface, a second surface, a first hole extending from the first surface to the second surface, and a second hole extending from the first surface to the second surface. The electric conductor is disposed in the first hole of the insulating body for contacting one of a plurality of balls of the first integrated circuit package and one of a plurality of conductor pads of the second integrated circuit package. The electric conductor includes an elastic body and electric conductor particles disbursed in the elastic body.

The spacer is disposed in the second hole. Preferably, the spacer has a thickness such that when the interconnect is compressed between first and second integrated circuit packages, the spacer limits the deformation of the elastic body and electric conductor of the interconnect to ensure a secure electric connection between the one of the balls of the first integrated circuit package and the one of the conductor pads of the second integrated circuit package. Alternatively or additionally, the spacer has a thickness such that when the interconnect is compressed between first and second integrated circuit packages, the spacer applies pressure to the middle area of the second integrated circuit package to maintain the mechanical and electrical integrity of the second integrated circuit package.

In an embodiment according to the first aspect of the invention, the first package is a memory package and the second package is a logic package.

In another embodiment according to the first aspect of the invention, the first package is a logic package and the second package is a memory package.

In yet another embodiment according to the first aspect of the invention, the elastic body is made of an elastomer.

In still another embodiment according to the first aspect of the invention, the electric conductor particles include nano-particles.

In a further embodiment according to the first aspect of the invention, the second hole is a hollow center.

According to a second aspect of the invention, a test assembly includes a first integrated circuit package, a second integrated circuit package, and an interconnect.

The first integrated circuit package includes a BGA.

The second integrated circuit package includes a plurality of conductor pads and a BGA.

The interconnect includes an elastic body, an electric conductor and a spacer. The elastic body includes a first surface for contacting the first integrated circuit package, a second surface for contacting the second integrated circuit package, a first hole extending from the first surface to the second surface, and a second hole extending from the first surface to the second surface. The electric conductor is disposed in the first hole of the insulating body for contacting one of the balls of the first integrated circuit package and one of the conductor pads of the second integrated circuit package. The electric conductor includes an elastic body and electric conductor particles disbursed in the elastic body.

The spacer is disposed in the second hole. Preferably, the spacer has a thickness such that when the interconnect is compressed between first and second integrated circuit packages, the spacer limits the deformation of the elastic body and electric conductor of the interconnect to ensure a secure electric connection between the one of the balls of the first integrated circuit package and the one of the conductor pads of the second integrated circuit package. Alternatively or additionally, the spacer has a thickness such that when the interconnect is compressed between first and second integrated circuit packages, the spacer applies pressure to the middle area of the second integrated circuit package to maintain the mechanical and electrical integrity of the second integrated circuit package.

In an embodiment according to the second aspect of the invention, the test assembly includes a socket bottom for receiving the second package.

In another embodiment according to the second aspect of the invention, the test assembly includes a lock mechanism that interlocks and compresses the first integrated circuit package, first interconnect, and second integrated circuit package against one another.

In still another embodiment according to the second aspect of the invention, the first package is a memory package and the second package is a logic package.

In yet another embodiment according to the second aspect of the invention, the first package is a logic package and the second package is a memory package.

In still yet another embodiment according to the second aspect of the invention, the elastic body is made of an elastomer.

In a further another embodiment according to the second aspect of the invention, the electric conductor particles include nanoparticles.

In a still further embodiment according to the second aspect of the invention, the second hole is a hollow center.

According to a third aspect of the invention, a test assembly includes a socket lid assembly, a first integrated circuit package, a second integrated circuit package, a motherboard, a first interconnect, a second interconnect, a socket bottom, a lock mechanism, and guide pins.

The first integrated circuit package includes a BGA.

The second integrated circuit package includes a plurality of conductor pads and a BGA.

The interconnect includes an elastic body, an electric conductor and a spacer. The elastic body includes a first surface for contacting the first integrated circuit package, a second surface for contacting the second integrated circuit package, a first hole extending from the first surface to the second surface, and a second hole extending from the first surface to the second surface.

The electric conductor is disposed in the first hole of the insulating body for contacting one of the balls of the first integrated circuit package and one of the conductor pads of the second integrated circuit package. The electric conductor includes an elastic body and electric conductor particles disbursed in the elastic body.

The spacer is disposed in the second hole. Preferably, the spacer has a thickness such that when the interconnect is compressed between first and second integrated circuit packages, the spacer limits the deformation of the elastic body and electric conductor of the interconnect to ensure a secure electric connection between the one of the balls of the first integrated circuit package and the one of the conductor pads of the second integrated circuit package. Alternatively or additionally, the spacer has a thickness such that when the interconnect is compressed between first and second integrated circuit packages, the spacer applies pressure to the middle area of the second integrated circuit package to maintain the mechanical and electrical integrity of the second integrated circuit package.

The second interconnect includes an elastic body and an electric conductor. The elastic body has a first surface for contacting the second integrated circuit package, a second surface for contacting the motherboard, and a hole extending from the first surface to the second surface. The electric conductor is disposed in the hole of the insulating body for contacting one of the balls of the second integrated circuit package and one of the conductor pads of the mother board. The electric conductor includes an elastic body and electric conductor particles disbursed in the elastic body.

The socket bottom is used to receive the second package, and is releasably connected to the motherboard.

The lock mechanism interlocks and compresses the socket lid assembly, first integrated circuit package, first interconnect, second integrated circuit package, second interconnect, and motherboard against one another.

The guide pins align the socket lid assembly, first integrated circuit package, first interconnect, second integrated circuit package, second interconnect, and motherboard.

In an embodiment according to the third aspect of the invention, the first package is a memory package and the second package is a logic package.

In another embodiment according to the third aspect of the invention, the first package is a logic package and the second package is a memory package.

In yet another embodiment according to the third aspect of the invention, the elastic body is made of an elastomer.

In still another embodiment according to the third aspect of the invention, the electric conductor particles include nanoparticles.

In a further embodiment according to the third aspect of the invention, the second hole is a hollow center.

DETAILED DESCRIPTION OF PREFERRED EMBODIMENTS

Figure 1:
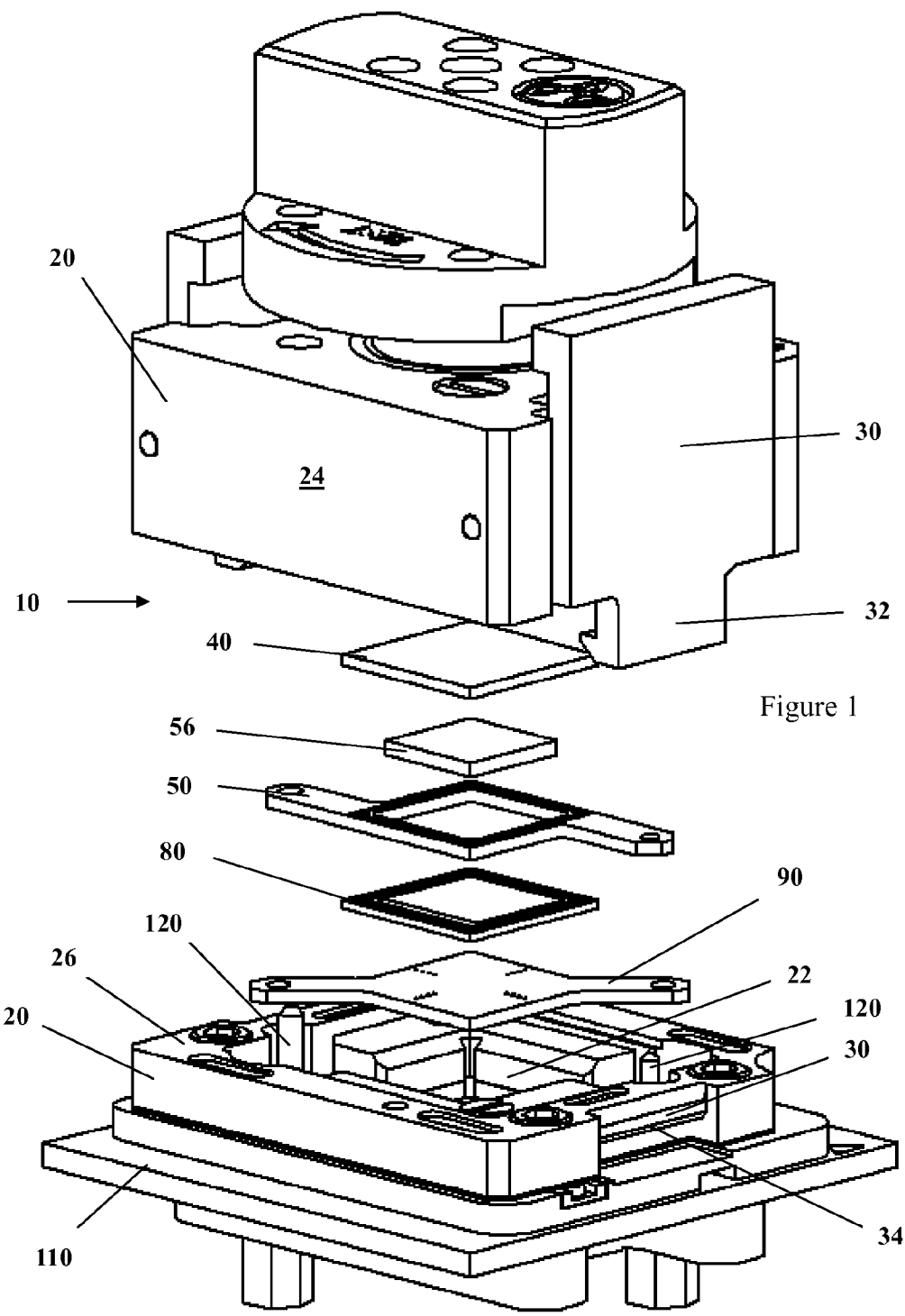
FIG. 1 is an exploded view of a test assembly according to the present invention.

FIG. 1 illustrates a test assembly 10 of the present invention. This test assembly 10 includes a socket 20, a first integrated circuit package 40, a first interconnect 50, a second integrated circuit package 80, a second interconnect 90, a motherboard 110, and guide pins 120.

The socket 20 includes a chamber 22 that is used to house the integrated circuit packages 40, 80 and interconnects 50, 90. The socket 20 includes a socket lid assembly 24 and a socket bottom 26, and the socket lid assembly 24 and socket bottom 26 define the chamber 22.

The socket 20 also includes a lock mechanism 30 that interlocks the socket lid assembly 24 and socket bottom 26 to form the socket chamber 22. The lock mechanism may be any one of conventional lock mechanisms. In the illustrated embodiment, the lock mechanism 30 includes a lock member on the socket lid assembly 24 and the receiving member on the socket bottom 26. Alternatively, the receiving member may be on the socket lid assembly 24 and the lock member on the socket bottom 26.

When it interlocks the socket lid assembly 24 and socket bottom 26, the lock mechanism 30 compresses the first integrated circuit package 40, first interconnect 50, second integrated circuit package 80, second interconnect 90, and motherboard 110 against one another.

The socket bottom 26 is releasably attached to the mother board 110. With the releasable attachment, the socket 20 can be easily replaced with another socket for testing integrated circuit packages of different sizes and configurations.

Figure 2A:
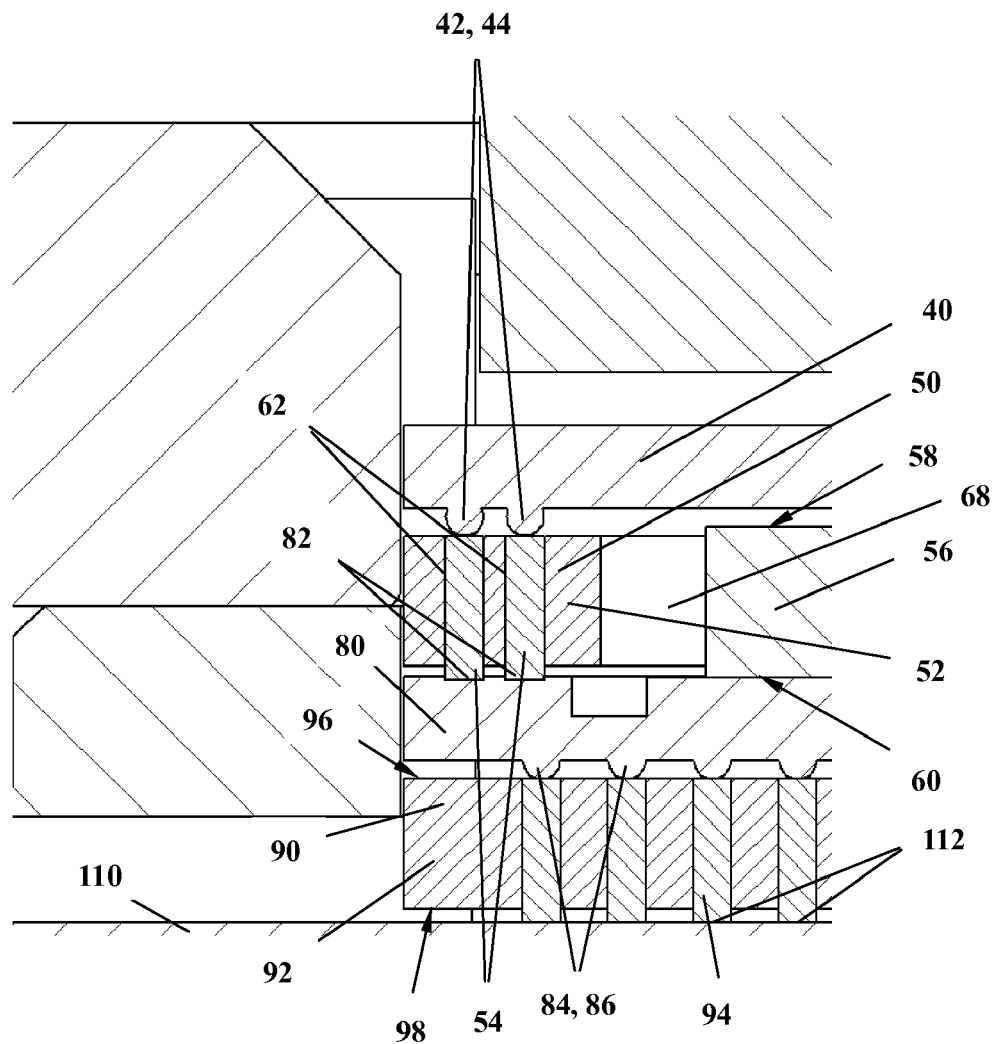
FIG. 2a is a partial sectional view of the test assembly of FIG. 1, wherein the memory package, interconnect and logic package are not compressed against one another.
Figure 2B:
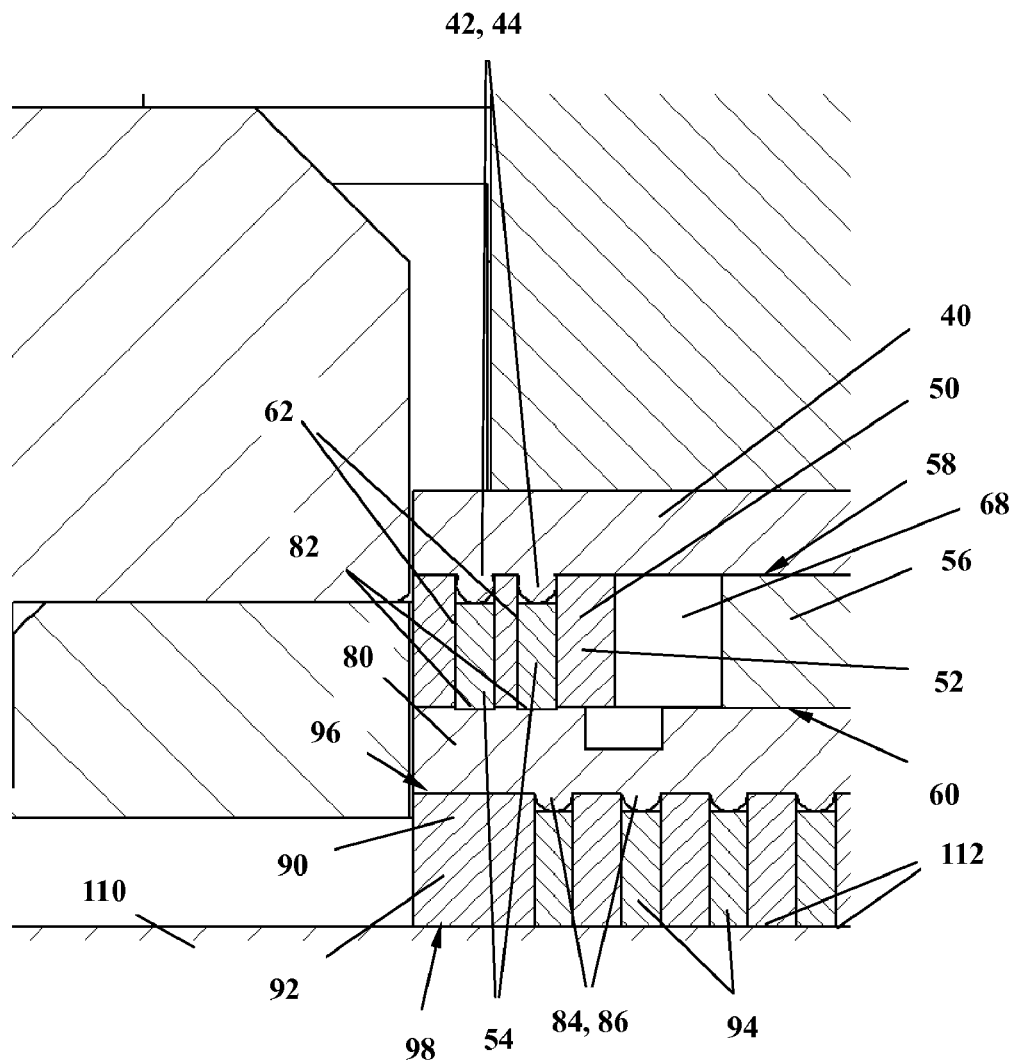
FIG. 2b is a partial sectional view of the test assembly of FIG. 1, wherein the memory package, interconnect and logic package are compressed against one another.

In the embodiment shown in FIG. 1, the first integrated circuit package 40 is a memory package of a PoP assembly. Alternatively, the first integrated circuit package can be an integrated circuit package of any type, such as a logic package of a PoP assembly. In the illustrated embodiment, as shown in FIGS. 2a and 2b, the first integrated circuit package 40 includes a BGA 42 on the bottom surface of the package 40. the BGA 42 includes two rows of solder balls 44 arranged along the periphery of the first integrated circuit package 40. The term "solder balls" as used in this application is broadly defined. In general, a "solder ball" may have any suitable configuration. For example, a "solder ball" may have a spherical or semi-spherical configuration. Alternatively, a "solder ball" may have a cubical or pyramidal configuration.

During testing, the second integrated circuit package 80 is placed below the first integrated circuit package 40. In the embodiment shown in FIG. 1, the second integrated circuit package 80 is a logical package of a PoP assembly. Alternatively, the second integrated circuit package can be an integrated circuit package of any type, such as a memory package of a PoP assembly. In the illustrated embodiment, as shown in FIGS. 2a and 2b, the second integrated circuit package 80 includes a plurality of conductor pads 82 on the top surface of the package 80. The conductor pads 82 include two rows arranged along the periphery of the second integrated circuit package 80 in a pattern that matches that of the solder balls 44 on the bottom of the first integrated circuit package 40.

Additionally, the second integrated circuit package 80 includes a BGA 84 on the bottom surface of the package 80. As shown in FIGS. 2a and 2b, the BGA 84 includes solder balls 86 on the bottom of the second integrated circuit package 80.

The first interconnect 50 is placed between the first integrated circuit package 40 and the second integrated circuit package 80 to provide an electrical connection between a solder ball 44 of the first integrated circuit package 40 and the corresponding conductor pad 82 of the second integrated circuit package 80.

As shown in FIGS. 1-4, the first interconnect 50 includes an elastic body 52, a plurality of electric conductors 54 and a spacer 56. The elastic body 52, made of a dielectric material, has a generally flat configuration and has a first surface 58 for contacting the first integrated circuit package 40 and a second surface 60 for contacting the second integrated circuit package 80. In the illustrated embodiment, the elastic body 52 is made of an elastomer such as silicone rubber, although it can be made of any suitable elastic material.

The elastic body 52 includes a plurality of through holes 62, each of which extends from the first surface 58 of the elastic body 52 to the second surface 60 of the elastic body 52. The pattern of the through holes 62 matches the pattern of the solder balls 44 on the bottom of the first integrated circuit package 40 and the pattern of the conductor pads 82 on the top surface of the second integrated circuit package 80, so that when the first interconnect 50 is placed between the first integrated circuit package 40 and the second integrated circuit package 80, the through holes 62 of the elastic body 52 are aligned with the solder balls 44 of the first integrated circuit package 40 and with the conductor pads 82 of the second integrated circuit package 80.

Figure 3:
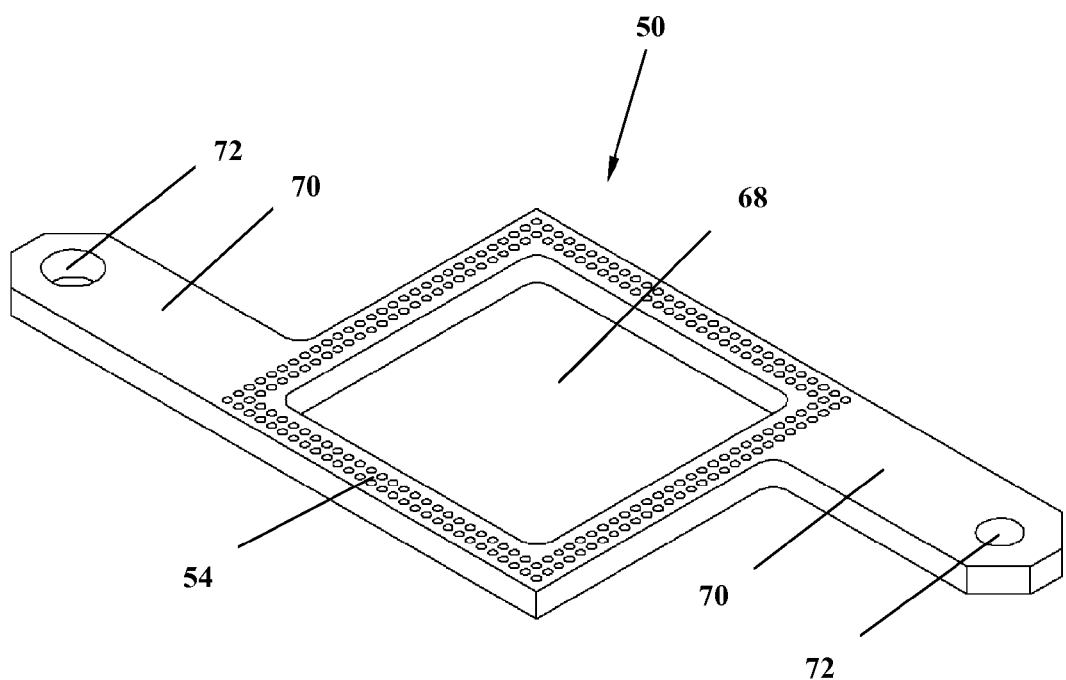
FIG. 3 is a perspective view of the interconnect of the test assembly of FIG. 1.
Figure 4:
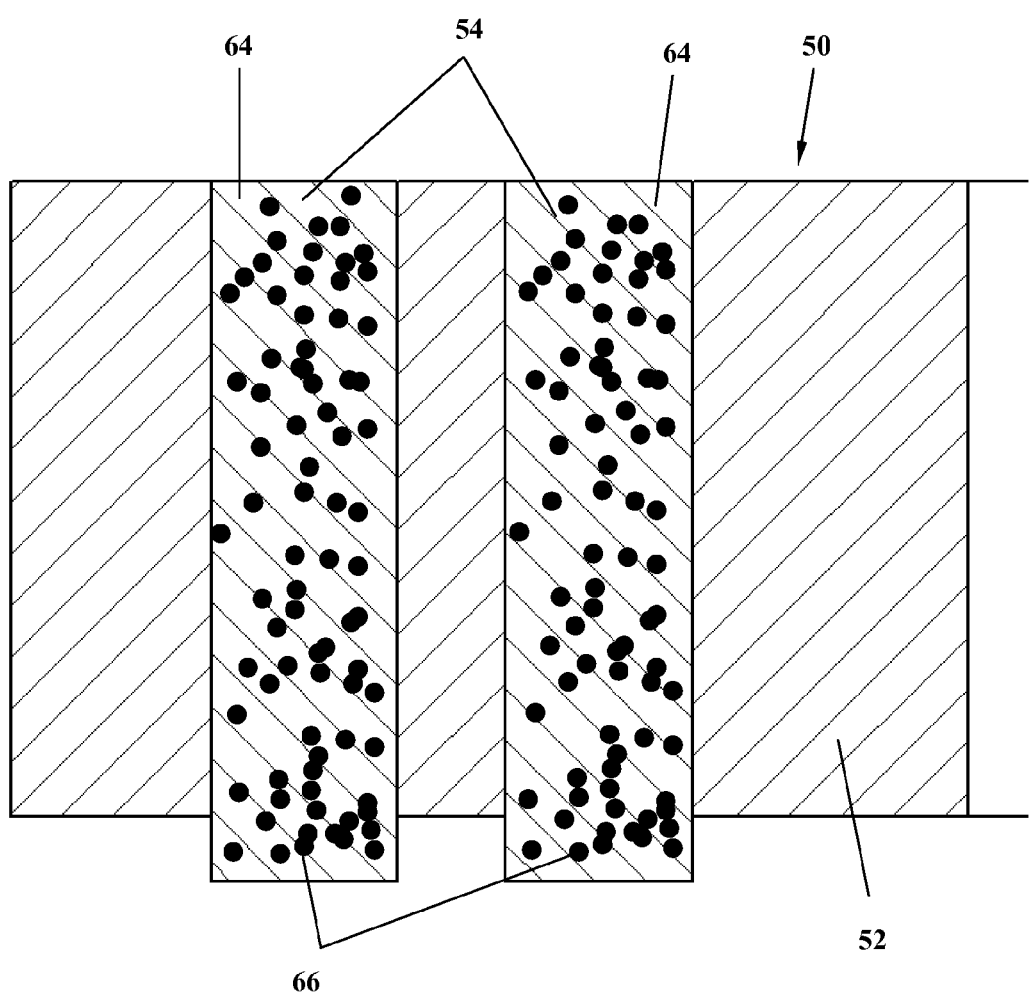
FIG. 4 is a cross-sectional view of conductors of the interconnect of FIG. 3.

In the illustrated embodiment, as shown in FIGS. 2-4, one of the electric conductors 54 is securely placed in each of the through holes 62. Preferably, each electric conductor 54 extends beyond the first surface 58 of the elastic body 52 and beyond the second surface 60 of the elastic body 52, to ensure that the electric conductor 54 comes in contact with the corresponding solder ball 44 of the first integrated circuit package 40 and conductor pad 82 of the second integrated circuit package 80.

As shown in FIG. 4, each of the electric conductors 54 includes an elastic body 64 and electric conductor particles 66 disbursed in the elastic body 64. In one embodiment, the electric conductor particles 66 are nanoparticles. In the illustrated embodiment, the elastic body 64 is made of an elastomer such as silicone rubber, although it can be made of any suitable elastic material. The electric conductor particles 66 provide the electric conductors 54 with electrical conductivity.

The elastic body 64 also includes another hole preferably in the form of a hollow center 68 extending from the first surface 58 of the elastic body 52 to the second surface 60 of the elastic body 52. The spacer 56 in the illustrated embodiment is placed within the hollow center 68. Preferably, the thickness of the spacer 56 is chosen so that when the first interconnect 50 is compressed between the first integrated circuit package 40 and second integrated circuit package 80 during testing, the spacer 56 limits the deformation of the elastic body 64 and electric conductors 54 of the interconnect 50 (i.e., how much the elastic body 64 and electric conductors 54 are compressed) to ensure secure electric connections between the solder balls 44 of the first integrated circuit package 40 and the conductor pads 82 of the second integrated circuit package 80.

The inventors of the present application discovered that without a limit on how much the elastic body 64 and electric conductors 54 are compressed during testing, the elastic body 64 and electric conductors 54 could be so deformed as to impair the electric connections between the solder balls 44 of the first integrated circuit package 40 and the conductor pads 82 of the second integrated circuit package 80. The spacer 56 therefore can be used to limit how much the elastic body 64 and electric conductors 54 are compressed. The thickness of the spacer 56 can be determined by experiment.

Alternatively or additionally, the spacer 56 has a thickness such that when the first interconnect 50 is compressed between the first integrated circuit package 40 and the second integrated circuit package 80, the spacer 56 applies pressure to the middle area of the second integrated circuit package 80 to maintain the mechanical and electrical integrity of the second integrated circuit package 80.

The inventors discovered that because of the structural or vertical stiffness differences between the first interconnect and the second interconnect, the first interconnect and the second interconnect may apply an uneven pressure against the second integrated circuit package 80. The uneven pressure may deform the second integrated circuit package 80, causing the second integrated circuit package 80 to malfunction or damaging the second integrated circuit package 80. For example, in the illustrated embodiment as shown in FIGS. 2a and 2b, the conductors 54 of the first interconnect 50 are arranged around the periphery of the first interconnect 50, while the conductors 94 of the second interconnect 90 are more evenly distributed. Because the conductors may be stiffer (or softer), the middle region of the second integrated circuit package 80 is pushed towards the first interconnect 50, potentially damaging the second integrated circuit package 80. The spacer 56, with the proper thickness, can counterbalance the pressure applied to the second integrated circuit package 80 by the middle portion of the second interconnect 90 to maintain the mechanical and electrical integrity of the second integrated circuit package 80.

In an alternative embodiment of the first interconnect, there may be more than one spacer. For example, there may be four spacers located at the four corners of a rectangular elastic body.

As shown in FIG. 3, the first interconnect 50 may include holes for the guide pins 120. In the illustrated embodiment, the first interconnect 50 includes two arms 70 and a hole 72 on each arm 70. When the test assembly 10 is assembled, a guide pin 120 extends through each hole 72 to align the first interconnect 50 with the first integrated circuit package 40 and second integrated circuit package 80.

The second interconnect 90 may be similar to the first interconnect 50 in some respects. The second interconnect 90 is placed between the second integrated circuit package 80 and the motherboard 110 to provide electrical connections between the solder balls 86 of the second integrated circuit package 80 and the corresponding conductor pads 112 of the motherboard 110.

The second interconnect 90 includes an elastic body 92 and a plurality of electric conductors 94. The second interconnect 90 may also include a spacer. The elastic body 92, made of a dielectric material, has a generally flat configuration and has a first surface 96 for contacting the second integrated circuit package 80 and a second surface 98 for contacting the motherboard 110. In the illustrated embodiment, the elastic body 92 is made of an elastomer such as silicone rubber, although it can be made of any suitable elastic material.

The elastic body 92 includes a plurality of through holes 100, each of which extends from the first surface 96 of the elastic body 92 to the second surface 98 of the elastic body 92. The pattern of the through holes 100 matches the pattern of the solder balls 86 on the bottom of the second integrated circuit package 80 and the pattern of the conductor pads 112 on the top surface of the motherboard 110, so that when the second interconnect 90 is placed between the second integrated circuit package 80 and the motherboard 110, the through holes 100 of the elastic body 92 are aligned with the solder balls 86 of the second integrated circuit package 80 and with the conductor pads 112 of the motherboard 110.

In the illustrated embodiment, one of the electric conductors 94 is securely placed in each of the through holes 100. Preferably, each electric conductor 94 extends beyond the first surface 96 of the elastic body 92 and beyond the second surface 98 of the elastic body 92, to ensure that the electric conductor 94 comes in contact with the corresponding solder ball 86 of the second integrated circuit package 80 and conductor pad 112 of the motherboard 110.

Just like the electric conductors 54 of the first interconnect 40, each of the electric conductors 94 of the second interconnect 90 includes an elastic body and electric conductor particles disbursed in the elastic body. In one embodiment, the electric conductor particles are nanoparticles. In the illustrated embodiment, the elastic body is made of an elastomer such as silicone rubber, although it can be made of any suitable elastic material. The electric conductor particles provide the electric conductors 94 with electrical conductivity.

The second interconnect 90 may include holes for the guide pins 120 for aligning the second interconnect 90 with the second integrated circuit package 80 and motherboard 110.

The guide pins 120 align the first integrated circuit package 40, first interconnect 50, second integrated circuit package 80, second interconnect 90, and motherboard 110.

The invention claimed is:

1. An interconnect comprising:
an insulating body having
a first surface,
a second surface,
a first hole extending from the first surface to the second surface, and
a second hole extending from the first surface to the second surface;
an electric conductor disposed in the first hole of the insulating body for contacting one of a plurality of balls of a first integrated circuit package and one of a plurality of conductor pads of a second integrated circuit package, the electric conductor including
an elastic body, and
electric conductor particles disbursed in the elastic body; and
a spacer disposed in the second hole.

2. The interconnect of claim 1, wherein the spacer disposed in the second hole has a thickness such that when the interconnect is compressed between first and second integrated circuit packages, the spacer limits the deformation of the elastic body and electric conductor of the interconnect to ensure a secure electric connection between the one of the balls of the first integrated circuit package and the one of the conductor pads of the second integrated circuit package.

3. The interconnect of claim 1, wherein the spacer has a thickness such that when the first interconnect is compressed between the first integrated circuit package and the second integrated circuit package, the spacer applies pressure to the middle area of the second integrated circuit package to maintain the mechanical and electrical integrity of the second integrated circuit package.

4. The interconnect of claim 1, wherein the elastic body is made of an elastomer.

5. The interconnect of claim 1, wherein the electric conductor particles include nanoparticles.

6. The interconnect of claim 1, wherein the second hole is a hollow center.

7. A test assembly comprising:
a first integrated circuit package including
a BGA;
a second integrated circuit package including
a plurality of conductor pads and a BGA; and
an interconnect including
an insulating body having
a first surface for contacting the first integrated circuit package,
a second surface for contacting the second integrated circuit package,
a first hole extending from the first surface to the second surface, and
a second hole extending from the first surface to the second surface,
an electric conductor disposed in the first hole of the insulating body for contacting one of the balls of the first integrated circuit package and one of the conductor pads of the second integrated circuit package, the electric conductor including
an elastic body, and
electric conductor particles disbursed in the elastic body, and
a spacer disposed in the second hole.

8. The test assembly of claim 7, wherein the spacer disposed in the second hole has a thickness such that when the interconnect is compressed between the first and second integrated circuit packages, the spacer limits the deformation of the elastic body and electric conductor of the interconnect to ensure a secure electric connection between the one of the balls of the first integrated circuit package and the one of the conductor pads of the second integrated circuit package.

9. The test assembly of claim 7, wherein the spacer has a thickness such that when the first interconnect is compressed between the first integrated circuit package and the second integrated circuit package, the spacer applies pressure to the middle area of the second integrated circuit package to maintain the mechanical and electrical integrity of the second integrated circuit package.

10. The test assembly of claim 7, further comprising a socket bottom for receiving the second package.

11. The test assembly of claim 7, further comprising a lock mechanism that interlocks and compresses the first integrated circuit package, first interconnect, and second integrated circuit package against one another.

12. The test assembly of claim 7, wherein the elastic body and the insulating body are made of an elastomer.

13. The test assembly of claim 7, wherein the electric conductor particles include nanoparticles.

14. The test assembly of claim 7, wherein the second hole is a hollow center.

15. A test assembly comprising:
a socket lid assembly;
a first integrated circuit package including
a BGA;
a second integrated circuit package including
a plurality of conductor pads and a BGA;
a motherboard;
a first interconnect including
an insulating body having
a first surface for contacting the first integrated circuit package,
a second surface for contacting the second integrated circuit package,
a first hole extending from the first surface to the second surface, and
a second hole extending from the first surface to the second surface,
an electric conductor disposed in the first hole of the insulating body for contacting one of the balls of the first integrated circuit package and one of the conductor pads of the second integrated circuit package, the electric conductor including
an elastic body, and
electric conductor particles disbursed in the elastic body, and
a spacer disposed in the second hole;
a second interconnect including
an insulating body having
a first surface for contacting the second integrated circuit package,
a second surface for contacting the motherboard,
a hole extending from the first surface to the second surface,
an electric conductor disposed in the hole of the insulating body for contacting one of the balls of the second integrated circuit package and one of the conductor pads of the mother board, the electric conductor including
an elastic body, and
electric conductor particles disbursed in the elastic body;
a socket bottom for receiving the second package, wherein the socket bottom is releasably connected to the motherboard;
a lock mechanism that interlocks and compresses the socket lid assembly, first integrated circuit package, first interconnect, second integrated circuit package, second interconnect, and motherboard against one another; and
guide pins that align the socket lid assembly, first integrated circuit package, first interconnect, second integrated circuit package, second interconnect, and motherboard.

16. The test assembly of claim 15, wherein the spacer disposed in the second hole has a thickness such that when the first interconnect is compressed between the first and second integrated circuit packages, the spacer limits the deformation of the elastic body and electric conductor of the first interconnect to ensure a secure electric connection between the one of the balls of the first integrated circuit package and the one of the conductor pads of the second integrated circuit package.

17. The test assembly of claim 15, wherein the spacer has a thickness such that when the first interconnect is compressed between the first integrated circuit package and the second integrated circuit package, the spacer applies pressure to the middle area of the second integrated circuit package to maintain the mechanical and electrical integrity of the second integrated circuit package.

18. The test assembly of claim 15, wherein the insulating bodies and the elastic bodies are made of an elastomer.

19. The test assembly of claim 15, wherein the electric conductor particles include nanoparticles.

20. The test assembly of claim 15, wherein the second hole is a hollow center.

* * * * *